United States Patent
Fukushima et al.

[11] Patent Number: 5,955,192
[45] Date of Patent: Sep. 21, 1999

[54] CONDUCTIVE CIRCUIT BOARD AND METHOD FOR MAKING

[75] Inventors: Motoo Fukushima; Yoshitaka Hamada; Shigeru Mori, all of Usui-gun, Japan

[73] Assignee: Shin-Etsu Chemical Co., Ltd., Tokyo, Japan

[21] Appl. No.: 08/974,501

[22] Filed: Nov. 19, 1997

[30] Foreign Application Priority Data

Nov. 20, 1996 [JP] Japan ................................. 8-324530

[51] Int. Cl.$^6$ ................. H01L 27/108; H01L 21/312; H01L 21/3205
[52] U.S. Cl. ................. 428/345; 428/344; 428/335; 174/258; 174/259; 156/307.1; 156/307.7; 430/83
[58] Field of Search ............... 528/10, 15, 31, 528/34; 430/83; 428/209, 335, 344, 345; 174/258, 259; 156/307.1, 307.7

[56] References Cited

U.S. PATENT DOCUMENTS

| | | | |
|---|---|---|---|
| 4,618,639 | 10/1986 | Takahashi et al. | 528/33 |
| 4,678,688 | 7/1987 | Itoh et al. | 528/28 |
| 4,950,726 | 8/1990 | Yoshioka et al. | 528/31 |
| 5,063,102 | 11/1991 | Lee et al. | 428/209 |
| 5,213,923 | 5/1993 | Yokoyama et al. | 430/58 |
| 5,237,033 | 8/1993 | Tabei et al. | 528/31 |
| 5,451,721 | 9/1995 | Tsukada et al. | 174/261 |

FOREIGN PATENT DOCUMENTS

| | | |
|---|---|---|
| 11339 | 1/1982 | Japan . |
| 72694 | 3/1993 | Japan . |
| 291273 | 10/1994 | Japan . |
| 114188 | 5/1995 | Japan . |

OTHER PUBLICATIONS

English Abstract of JP 5–72694.
English Abstract of JP 6–291273.
English Abstract of JP 7–114188.
English Abstract of JP 57–11339.

*Primary Examiner*—Timothy Speer
*Assistant Examiner*—Cathy F. Lam
*Attorney, Agent, or Firm*—Millen, White, Zelane, & Branigan, P.C.

[57] ABSTRACT

A conductive circuit board is prepared by forming a film of organopolysilane having a H-Si bond on a substrate, selectively exposing the organopolysilane film to light to form a photo-crosslinked layer in exposed areas, dissolving away unexposed areas, and contacting a silver salt with the photo-crosslinked layer and reducing the silver salt to form a silver conductive layer thereon. A conductive circuit board comprising a circuit-patterned film of photo-crosslinked polymer on a substrate and a silver conductive layer on the film has high and stable electric property.

14 Claims, 2 Drawing Sheets

CONDUCTIVE CIRCUIT BOARD AND METHOD FOR MAKING

BACKGROUND OF THE INVENTION

1. Field of the Invention

This invention relates to a highly conductive circuit board having a high precision by utilizing organopolysilane film and a method for preparing the same.

2. Prior Art

Organopolysilane is very interesting in that it has the metallic and electron delocalization properties of silicon in contrast to carbon, and the desirable properties of high heat resistance, high flexibility and ready adaptation to thin film formation. Highly conductive organopolysilane materials are obtained by oxidizing an organopolysilane having an amino group on a side chain with iodine or by oxidizing such an organopolysilane with ferric chloride vapor. For the purpose of developing photoresists for forming various ultrafine patterns at a high precision, active research works have been made on organopolysilane as disclosed in JP-A 72694/1993, 291273/1994, and 114188/1995. Inter alia, JP-A 72694/1993 discloses a method for preparing a semiconductor integrated circuit wherein organopolysilane optionally doped with iodine is used as a conductive layer and a siloxane layer converted from organopolysilane by light irradiation is used as an insulating layer. However, the use of corrosive iodine is an obstacle to the application of the doped organopolysilane as electronic materials. Additionally, since organopolysilane itself readily changes into siloxane by the action of atmospheric oxygen, the use of such organopolysilane as conductive material encounters difficulty in the application as electronic material where reliability is essential.

JP-A 11339/1982 discloses a method for forming a metal image by exposing a compound having a Si—Si bond to light and contacting the compound with a metal salt solution. Upon contact of a compound having a Si—Si bond with a metal salt solution, the metal salt must be reduced to a metal. This method is to form a positive metal image. An attempt was made to modify the method to the negative type so that a ultrafine image might be formed, but failed to form a precise fine circuit because the reduction of a silver salt did not quickly proceed on exposed areas of the polymer.

SUMMARY OF THE INVENTION

Therefore, an object of the invention is to provide a conductive circuit board having a high precision, high conductivity circuit formed in a negative pattern and a method for preparing the same through simple steps at a low cost.

We have found that an organopolysilane having a H—Si bond undergoes crosslinking reaction upon exposure to radiation, typically ultraviolet radiation whereby the exposed portion becomes insoluble in solvents. The photo-crosslinked portion serves to readily reduce a silver salt to form silver grains which accomplish stable electrical conduction. The present invention is predicated on this finding.

According to a first aspect, the present invention provides a conductive circuit board comprising a substrate, a circuit-patterned film of an organopolysilane having a H—Si bond crosslinked by light and a silver conductive layer formed on the crosslinked portion.

According to a second aspect of the present invention, a conductive circuit board is prepared by forming a film of an organopolysilane having a H—Si bond on a substrate; subjecting the organopolysilane film to selective light exposure, thereby forming a solvent-insoluble photo-crosslinked layer in exposed areas; removing unexposed areas of the organopolysilane film; and contacting a silver salt with the photo-crosslinked layer to form a silver conductive layer thereon.

BRIEF DESCRIPTION OF THE DRAWINGS

FIG. 1 is a cross-sectional view of an organopolysilane film on a substrate.

FIG. 2 illustrates the selective light exposure of the organopolysilane film through a mask.

FIG. 3 illustrates the removal of unexposed areas.

FIG. 4 is a cross-sectional view of a conductive circuit board having a silver conductive layer formed thereon.

DESCRIPTION OF THE PREFERRED EMBODIMENTS

Figure 1:
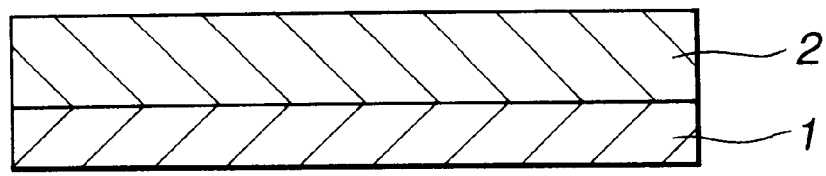
FIGS. 1 to 4 illustrate a method for preparing a conductive circuit board according to the invention.

The conductive circuit board according to the present invention includes a circuit-patterned film of formed by selectively exposing an organopolysilane having a H—Si bond on a substrate to a light and contacting a silver salt with the film and reducing the salt to form a silver conductive layer.

If desired or on a purpose of the conductive circuit board, the substrate used herein may be properly selected from various materials including insulators such as glass, ceramics, and plastics, semiconductors such as silicon, and conductors such as aluminum.

The organopolysilane film formed on the substrate is an organopolysilane having a H—Si bond, especially an organopolysilane having at least two H—Si bonds in a molecule and soluble in organic solvents. Preferably, the organopolysilane is of the following formula (1):

$$(H_m R^1_n X_p Si)_q \qquad (1)$$

In formula (1), $R^1$ is a substituted or unsubstituted aliphatic, alicyclic or aromatic monovalent hydrocarbon group. The aliphatic hydrocarbon groups are preferably those having 1 to 12 carbon atoms, more preferably 1 to 8 carbon atoms, for example, an alkyl group such as methyl, ethyl, propyl, butyl, pentyl and hexyl, and a cycloalkyl group such as cyclopentyl and cyclohexyl. The aromatic hydrocarbon groups are preferably those having 6 to 14 carbon atoms, more preferably 6 to 10 carbon atoms, for example, an aryl group such as phenyl, tolyl, xylyl and naphthyl, and an aralkyl group such as benzyl and phenethyl. The substituted hydrocarbon groups are substituted ones of the above-exemplified hydrocarbon groups wherein some or all of the hydrogen atoms are replaced by halogen atoms, alkoxy, amino, aminoalkyl or other groups, for example, p-dimethylaminophenyl and m-dimethylaminophenyl groups.

X is as defined for $R^1$ or an alkoxy group or halogen atom. Exemplary alkoxy groups are those having 1 to 4 carbon atoms, such as methoxy and ethoxy. Exemplary halogen atoms are chlorine and bromine. Most often, a chlorine atom, methoxy group and ethoxy group are used. The group X serves to prevent the organopolysilane film from stripping from the substrate, that is, to improve adhesion.

Letters m, n, and p are numbers satisfying $0.1 \leq m \leq 1$, especially $0.5 \leq m \leq 1$, $0.1 \leq n \leq 2$, especially $0.5 \leq n \leq 1.5$, $0 \leq p \leq 0.5$, especially $0 \leq p \leq 0.2$, and $1 \leq m+n+p \leq 2.2$, especially $1.5 \leq m+n+p \leq 2.2$. Letter q is an integer of $10 \leq q \leq 100,000$, especially $10 \leq q \leq 10,000$.

Referring to FIGS. 1 to 4, the method for preparing a conductive circuit board is described step by step.

First, an organopolysilane film 2 is formed on a substrate 1 as shown in FIG. 1. The organopolysilane film preferably has a thickness of 0.01 to 100 μm, especially 0.1 to 20 μm.

Any desired method may be used for forming the organopolysilane film. Conventional thin film forming methods are useful, for example, spin coating, dipping, casting, vacuum deposition, and Langmuir-Blodgett (LB) methods. Especially preferred is a spin coating method of applying an organopolysilane solution to a substrate rotating at a high speed. Examples of the solvent in which the organopolysilane is dissolved include aromatic hydrocarbons such as benzene, toluene and xylene and ether solvents such as tetrahydrofuran (THF) and dibutyl ether. After coating, the coated material may be dried by keeping it in a drying atmosphere for a while or by allowing it to stand in vacuum at a temperature of about 40 to 60° C. The organopolysilane solution preferably has a concentration of 1 to 20% by weight whereby an organopolysilane thin film having a thickness of 0.01 to 100 μm can be formed.

The organopolysilane having a H—Si bond undergoes crosslinking reaction upon exposure to radiation such as ultraviolet radiation. The crosslinked polymer is insoluble in organic solvents. Even after crosslinking by light exposure, the polymer serves to reduce a silver salt, in contact therewith into silver grains, accomplishing high and stable electrical conduction.

Figure 2:
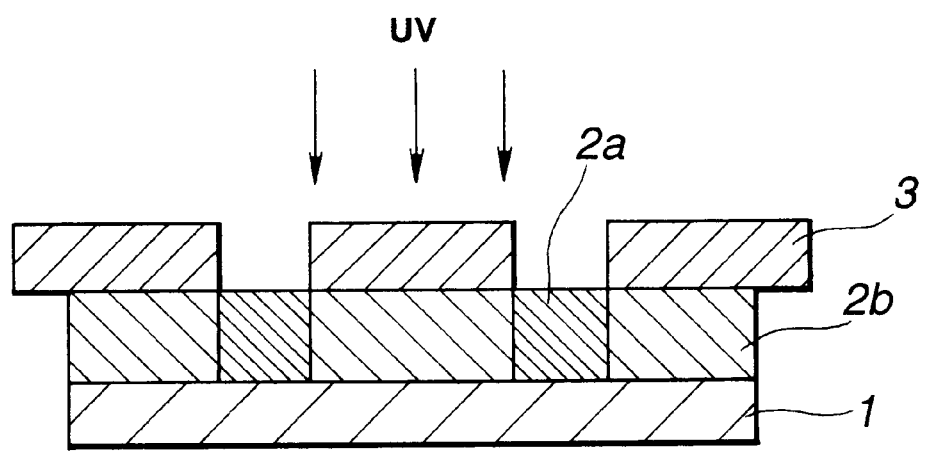

Then, as shown in FIG. 2, a patterned mask 3 is placed on the organopolysilane film 2. Light having a wavelength of less than 500 nm, especially ultraviolet light from a suitable source is irradiated to the organopolysilane film 2 through the mask 3. Only in the exposed areas of the organopolysilane film 2, crosslinking occurs to convert the film into a solvent insoluble state. The light source used herein may be selected from continuous spectrum light sources such as hydrogen discharge lamps, rare gas discharge lamps, tungsten lamps, and halide lamps and discontinuous spectrum light sources such as lasers and mercury lamps. Mercury lamps are preferred because they are inexpensive and easy to handle. Light exposure is preferably made in a dose of 0.01 to 100 J/cm² for an organopolysilane film thickness of 1 μm.

Figure 3:
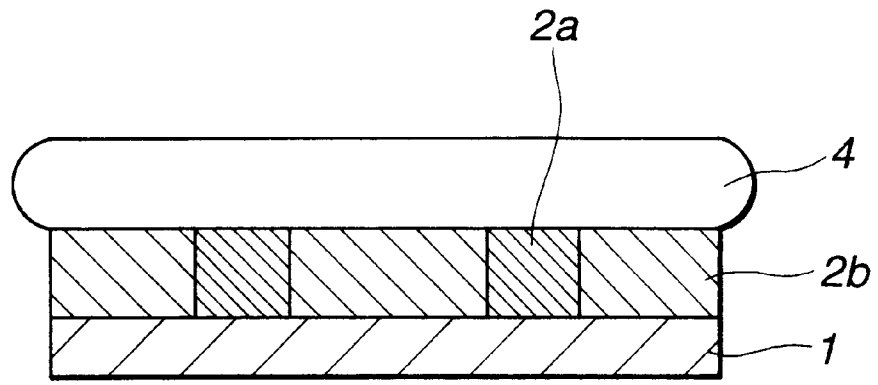

As a result of light exposure, exposed areas 2a of the organopolysilane film 2 become photo-crosslinked areas while unexposed areas 2b remain unchanged. The mask 3 is then removed and the organopolysilane film 2 is contacted with an organic solvent 4 as shown in FIG. 3. The unexposed areas 2b of organopolysilane are removed. Since the organopolysilane, whether or not it has been exposed to light, possesses a chemically reducing ability to readily reduce a silver salt into silver grains to provide high electrical conduction, the unexposed areas 2b of the organopolysilane film must be removed after light exposure as by dissolving away in a solvent, in order to form a conductive circuit.

For the removal of the unexposed areas 2b of the organopolysilane film, a solvent capable of dissolving the organopolysilane, but not destroying the pattern of crosslinked portion, is used. Exemplary solvents are aromatic hydrocarbons such as benzene and toluene, ethers such as diethyl ether and THF, and esters such as ethyl acetate. Aromatic hydrocarbon solvents are effective especially for phenylhydrogenpolysilane.

Figure 4:
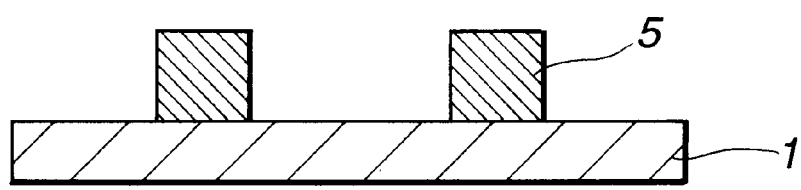

Next, a silver salt is contacted with the photo-crosslinked polymer layer 2a whereby the silver salt is reduced to form a silver conductive layer 5 as shown in FIG. 4.

The silver salt used herein is preferably a salt of monovalent silver ion $Ag^+$. The preferred silver salt is represented by Ag—Z wherein Z is perchlorate, tetramethyl borate, pentafluorophosphate, trifluoromethane sulfonate, tetrafluoroborate, tetraphenyl borate or nitrate. Examples of the silver salt include $AgBF_4$, $AgClO_4$, $AgPF_6$, $AgBPh_4$ $Ag(CF_3SO_3)$, and $AgNO_3$.

For achieving contact, there may be used a vapor phase method of exposing the crosslinked polymer to a vapor atmosphere of the silver salt or a solution method of contacting a solution of the silver salt with the crosslinked polymer. The vapor phase method is generally carried out at a temperature of 50 to 300° C. Temperatures below 50° C. would lead to slow contact whereas temperatures above 300° C. would deteriorate the polymer upon contact. A pressure of 0.001 mmHg to atmospheric pressure is usually used. A vacuum below 0.001 mmHg is economically disadvantageous because a long time is required until such a vacuum is reached. Above atmospheric pressure, the contact rate becomes very low.

In the solution method, a solvent capable of dissolving the silver salt, but not destroying the pattern of cross-linked areas is used. The type of solvent cannot be specified since solubility varies with the type of a side chain group of the polymer. Examples of the solvent include water, ketones such as acetone and methyl ethyl ketone, esters such as ethyl acetate, alcohols such as methanol and ethanol, aprotic polar solvents such as dimethylformamide, dimethylsulfoxide, and hexamethylphosphoric triamide, and nitromethane and acetonitrile though not limited thereto. Alcohols are effective especially for phenylhydrogenpolysilane.

The film-bearing substrate is contacted with a solution of the silver salt by spreading the solution or dipping in the solution, followed by drying. Then the silver salt is reduced into silver grains on the crosslinked polymer areas. As a result, a patterned conductive circuit board is obtained.

The board is generally dried, preferably at a temperature of 0 to 150° C. under atmospheric pressure or vacuum. If necessary, heat treatment is carried out at a temperature of 50 to 600° C. preferably under a non-oxidizing atmosphere such as nitrogen and argon whereby the reduction of the silver salt to silver is promoted on the crosslinked polymer layer to further increase conductivity. This results in a greater difference in conductivity between exposed and unexposed areas, which is more desirable as a conductive circuit.

According to the invention, a conductive circuit board having a conductive layer of high conductivity formed in a negative pattern and experiencing a minimal change of conductivity with aging can be produced at a high precision through inexpensive simple steps. The conductive circuit board will find use in the electric, electronic and communication fields as flexible switches, battery electrodes, solar cells, sensors, antistatic protective films, electromagnetic shield casings, integrated circuits, and motor casings.

EXAMPLE

Examples of the invention are given below by way of illustration and not by way of limitation.

Synthesis Example

In a flask purged with argon, methyl lithium in diethyl ether was added to bis(cyclopentadienyl) zirconiumdichloride to form bis(cyclopentadienyl) dimethylzirconium catalyst in the system. To the flask, phenyltrihydrosilane was added in an amount of 50 mol per mol of the catalyst. The contents were heated and stirred at 100° C. for 24 hours. The catalyst was removed from the reaction solution by adding florisil thereto followed by filtration. A solid of phenylhydrogenpolysilane having a weight average molecular weight of 2,600 was obtained in a substantially quantitative amount.

Example

The phenylhydrogenpolysilane prepared in Synthesis Example was dissolved in toluene to form a 10 wt % organopolysilane solution. The organopolysilane solution was spin coated on a glass plate at 3,000 rpm for 10 seconds and dried at 50° C. and 2 mmHg to form a thin film of 0.5 μm thick. There was obtained a substrate 1 having an organopolysilane film 2 formed thereon as shown in FIG. 1, which was subject to a patterning step.

With a photomask of a predetermined pattern rested on the coated substrate, a 20-W low pressure mercury lamp was burned to illuminate ultraviolet radiation of 254 nm to the organopolysilane film in air in a dose of 10 J/Cm². Exposed areas of the organopolysilane film were converted into photo-crosslinked areas. There was obtained a glass substrate 1 having a film which was patterned into unexposed areas 2b and photo-crosslinked areas 2a as shown in FIG. 2.

Toluene was spin coated on the substrate at 3,000 rpm for 2 seconds and dried at 50° C. and 2 mmHg whereby the unexposed areas of the organopolysilane film were removed (FIG. 3).

The substrate having the patterned film was dipped in an ethanol solution of 10 wt % silver tetrafluoroborate for 10 seconds, taken out of the solution, and dried at 50° C. and 2 mmHg. Only on the photo-crosslinked layer, the silver salt was reduced to form a silver circuit corresponding to the photo-crosslinked layer. Thereafter, the substrate was immersed in ethanol for 2 seconds and dried at 50° C. and 2 mmHg. The silver salt which had directly deposited on the glass substrate surface (non-circuit portion) was completely removed away (FIG. 4).

The thus obtained substrate was heated at 200° C. for 30 minutes and allowed to cool down to room temperature. Immediately after the preparation of the conductive circuit board and after 1 month, the silver circuit portion and the non-circuit portion were measured for conductivity, with the results shown below.

Electric Properties as Prepared
Silver circuit portion conductivity: 1×10 S/cm
Non-circuit portion conductivity: 1×10⁻¹² S/cm
Ratio of silver circuit portion conductivity/non-circuit portion conductivity: 10¹³
Electric Properties after 1 Month Aging
Silver circuit portion conductivity: 1×10 S/cm
Non-circuit portion conductivity: 1×10⁻¹² S/cm
Ratio of silver circuit portion conductivity/non-circuit portion conductivity: 10¹³

It is thus evident that the electrical property remained unchanged after 1 month.

For comparison purposes, the above procedure was repeated using phenylmethylpolysilane and methylhydrogenpolysiloxane having reducing nature. When toluene was spin coated at 3,000 rpm for 2 seconds, the silane film including both unexposed and exposed areas was entirely removed. A conductive circuit could not be formed.

Japanese Patent Application No. 324530/1996 is incorporated herein by reference.

Although some preferred embodiments have been described, many modifications and variations may be made thereto in the light of the above teachings. It is therefore to be understood that within the scope of the appended claims, the invention may be practiced otherwise than as specifically described.

We claim:

1. A conductive circuit board comprising a substrate and a circuit-pattern film formed thereon, said circuit-pattern film comprising a photo-crosslinked layer and a silver conductive layer formed on the photo-crosslinked layer, said circuit-pattern layer being formed by:
   exposing to light, selectively in a circuit pattern, a film of an organopolysiloxane having a H—Si bond on a substrate, thereby forming the photo-crosslinked layer in the circuit pattern in the exposed area,
   removing the unexposed area of the organopolysiloxane film, and
   contacting the photo-crosslinked pattern with a silver salt to form the silver conductive layer on the photo-crosslinked layer in the circuit pattern.

2. The conductive circuit board of claim 1 wherein the organopolysilane having a H—Si bond is of the following formula (1):

$$(H_m R^1_n X_p Si)_q \qquad (1)$$

wherein $R^1$ is a substituted or unsubstituted monovalent hydrocarbon group, X is $R^1$ or an alkoxy group or halogen atom, letters m, n, and p are numbers satisfying $0.1 \leq m \leq 1$, $0.1 \leq n \leq 2$, $0 \leq p \leq 0.5$, and $1 \leq m+n+p \leq 2.2$, and letter q is an integer of $10 \leq q \leq 100,000$.

3. The conductive circuit board of claim 1, wherein the substrate is of an insulator material.

4. The conductive circuit board of claim 1, wherein the substrate is of a semiconductor material.

5. The conductive circuit board of claim 1, wherein the substrate is of a conductor material.

6. The conductive circuit board of claim 2, wherein $R^1$ is an alkyl group, cycloalkyl group, phenyl group, tolyl group, xylyl group, naphthyl group, benzyl group or phenethyl group, each of 1–12 carbon atoms and optionally substituted by halogen, alkoxy, amino or aminoalkyl groups; and, wherein X is as defined for $R^1$ herein or is an alkoxy or halogen group.

7. The conductive circuit board of claim 2, wherein m, n and p satisfy $0.5 \leq m \leq 1$, $0.5 \leq n \leq 1.5$, $0 \leq p \leq 0.2$ and $1.5 \leq m+n+p \leq 2.2$; and $10 \leq q \leq 10,000$.

8. The conductive circuit board of claim 1, wherein the film of an organopolysiloxane having a H—Si bond has a thickness of 0.01 to 100 μm.

9. The conductive circuit board of claim 1, wherein the light to which the film of an organopolysiloxane having a H—Si bond is exposed is UV light.

10. The conductive circuit board of claim 1, wherein the silver salt is of the formula Ag—Z wherein Z is a perchlorate, tetramethylborate, pentafluorophosphate, trifluoromethane sulfonate, tetrafluoroborate, tetraphenyl borate or nitrate.

11. The conductive circuit board of claim 1, wherein the contacting of the photo-crosslinked pattern with a silver salt is conducted by exposure to a vapor atmosphere of the silver salt.

12. The conductive circuit board of claim 1, wherein the contacting of the photo-crosslinked pattern with a silver salt is conducted by exposure to a solution of the silver salt in a solvent which will not dissolve the photo-crosslinked pattern.

13. A method for preparing a conductive circuit board comprising the steps of:
   forming a film of an organopolysilane having a H—Si bond on a substrate,
   subjecting the organopolysilane film to selective light exposure in a circuit pattern, thereby forming a solvent-insoluble photo-crosslinked layer in exposed areas, removing unexposed areas of the organopolysilane film, and contacting a silver salt with the photo-crosslinked layer to form a silver conductive layer thereon.

14. The method for preparing a conductive circuit board of claim 13, wherein the organopolysilane having a H—Si bond is of the following formula (1):

$$(H_m R^1_n X_p Si)_q \tag{1}$$

wherein $R^1$ is a substituted or unsubstituted monovalent hydrocarbon group, X is $R^1$ or an alkoxy group or halogen atom, letters m, n, and p are numbers satisfying $0.1 \leq m \leq 1$, $0.1 \leq n \leq 2$, $0 \leq p \leq 0.5$, and $1 \leq m+n+p \leq 2.2$, and letter q is an integer of $10 \leq q \leq 100,000$.

* * * * *